United States Patent
Liu et al.

(10) Patent No.: US 10,784,336 B2
(45) Date of Patent: Sep. 22, 2020

(54) GALLIUM NITRIDE HIGH ELECTRON MOBILITY TRANSISTOR AND GATE STRUCTURE THEREOF

(71) Applicant: Excelliance MOS Corporation, Hsinchu County (TW)

(72) Inventors: Chu-Kuang Liu, Hsinchu County (TW); Hung-Kun Yang, Hsinchu County (TW)

(73) Assignee: Excelliance MOS Corporation, Hsinchu County (TW)

(*) Notice: Subject to any disclaimer, the term of this patent is extended or adjusted under 35 U.S.C. 154(b) by 0 days.

(21) Appl. No.: 16/362,704

(22) Filed: Mar. 25, 2019

(65) Prior Publication Data
US 2020/0212173 A1    Jul. 2, 2020

(30) Foreign Application Priority Data
Dec. 26, 2018  (TW) ............... 107147082 A

(51) Int. Cl.
*H01L 29/06*  (2006.01)
*H01L 29/20*  (2006.01)
*H01L 29/205* (2006.01)
*H01L 29/10*  (2006.01)
*H01L 29/778* (2006.01)

(52) U.S. Cl.
CPC .......... *H01L 29/0607* (2013.01); *H01L 29/10* (2013.01); *H01L 29/2003* (2013.01); *H01L 29/205* (2013.01); *H01L 29/7787* (2013.01)

(58) Field of Classification Search
CPC ............... H01L 29/778; H01L 29/2003; H01L 29/7787; H01L 29/66462
See application file for complete search history.

(56) References Cited

U.S. PATENT DOCUMENTS 9,318,593 B2   4/2016   Wu et al.
9,425,301 B2   8/2016   Chiu et al.
(Continued)

FOREIGN PATENT DOCUMENTS

| TW | 201044576 | 12/2010 |
| TW | 201324773 | 6/2013 |
| TW | 201624701 | 7/2016 |

OTHER PUBLICATIONS

"Office Action of Taiwan Counterpart Application," dated May 7, 2019, p. 1-p. 6.

*Primary Examiner* — Changhyun Yi
(74) *Attorney, Agent, or Firm* — JCIPRNET

(57) ABSTRACT

A gate structure for gallium nitride (GaN) high electron mobility transistor (HEMT) includes a heterogeneous structure, a doped GaN layer, an insulating layer, an undoped GaN layer, and a gate metal layer. The heterogeneous structure includes a channel layer and a barrier layer on the channel layer. The doped GaN layer is disposed on the barrier layer, the insulating layer is disposed on both sides of the top portion of the doped GaN layer, and the undoped GaN layer is disposed between the doped GaN layer and the insulating layer. The gate metal layer is disposed on the doped GaN layer and covers the insulating layer and the undoped GaN layer. The undoped GaN layer can protect the underlying doped GaN layer, and the insulating layer has the effect of preventing gate leakage.

10 Claims, 2 Drawing Sheets

(56) References Cited

U.S. PATENT DOCUMENTS

2012/0138948 A1* 6/2012 Miyajima .......... H01L 29/4236
                                                                257/76
2012/0313106 A1   12/2012 He
2017/0317179 A1   11/2017 Cao et al.

* cited by examiner

GALLIUM NITRIDE HIGH ELECTRON MOBILITY TRANSISTOR AND GATE STRUCTURE THEREOF

CROSS-REFERENCE TO RELATED APPLICATION

This application claims the priority benefit of Taiwan application serial no. 107147082, filed on Dec. 26, 2018. The entirety of the above-mentioned patent application is hereby incorporated by reference herein and made a part of specification.

BACKGROUND

Technical Field

The present disclosure relates to a high electron mobility transistor (HEMT) technique, and more particularly to a gallium nitride HEMT and a gate structure thereof.

Description of Related Art

In gallium nitride high electron mobility transistor (HEMT), a heterogeneous structure including aluminum gallium nitride (AlGaN) and gallium nitride (GaN) is utilized to generate two-dimensional electron gas (2 DEG) having high planar charge density and high electron mobility at the junction therebetween, and thus the gallium nitride HEMT is suitable for operation under high power, high frequency and high temperature.

The gallium nitride HEMT with a high concentration of 2 DEG adopts a normally-off circuit design. However, serious leakage at gate has occurred in such a gallium nitride HEMT, which causes low or fail switch of transistor under abnormal operation, resulting in low reliability.

SUMMARY

The disclosure provides a gallium nitride HEMT and a gate structure thereof, which is capable of greatly reducing gate leakage.

The gate structure of the gallium nitride HEMT of the present disclosure includes a heterogeneous structure, a doped gallium nitride layer, an insulating layer, an undoped gallium nitride layer, and a gate metal layer. The heterogeneous structure includes a channel layer and a barrier layer on the channel layer. The doped gallium nitride layer is disposed on the barrier layer, the insulating layer is disposed on both sides of the top of the doped gallium nitride layer, and the undoped gallium nitride layer is disposed between the doped gallium nitride layer and the insulating layer. The gate metal layer is disposed on the doped gallium nitride layer and covers the insulating layer and the undoped gallium nitride layer.

In an embodiment of the disclosure, the undoped gallium nitride layer completely covers the doped gallium nitride layer.

In another embodiment of the present disclosure, the undoped gallium nitride layer covers a portion of the doped gallium nitride layer, such that the gate metal layer directly contacts the doped gallium nitride layer.

In an embodiment of the disclosure, the doped gallium nitride layer may be a p-type gallium nitride layer or an n-type gallium nitride layer.

In an embodiment of the disclosure, the material of the insulating layer is, for example, silicon nitride ($Si_3N_4$), aluminum oxide ($Al_2O_3$), silicon oxide ($SiO_2$), boron nitride (BN) or aluminum nitride (AlN).

In an embodiment of the disclosure, a ratio of the area of the insulating layer to the area of the top of the doped gallium nitride layer is about 50% or less.

In an embodiment of the disclosure, the area of the bottom of the doped gallium nitride layer may be greater than or equal to the area of the top portion.

In an embodiment of the disclosure, the undoped gallium nitride layer has a thickness of, for example, less than 200 angstroms.

In an embodiment of the disclosure, the side surface of the gate metal layer may be aligned with the side surface of the insulating layer.

In an embodiment of the disclosure, the material of the channel layer is, for example, gallium nitride (GaN) and a material of the barrier layer such as aluminum gallium nitride (AlGaN).

The gallium nitride HEMT of the present disclosure has the above-described gate structure.

Based on the above, according to the present disclosure, the current leakage at the gate side can be blocked through the insulating layer disposed at the bottom on both sides of the gate metal layer. Moreover, the undoped gallium nitride layer is disposed between the insulating layer and the doped gallium nitride layer, and thus it may protect the doped gallium nitride layer to ensure its performance. Therefore, the gate structure of the present disclosure may improve the reliability of a gallium nitride HEMT.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
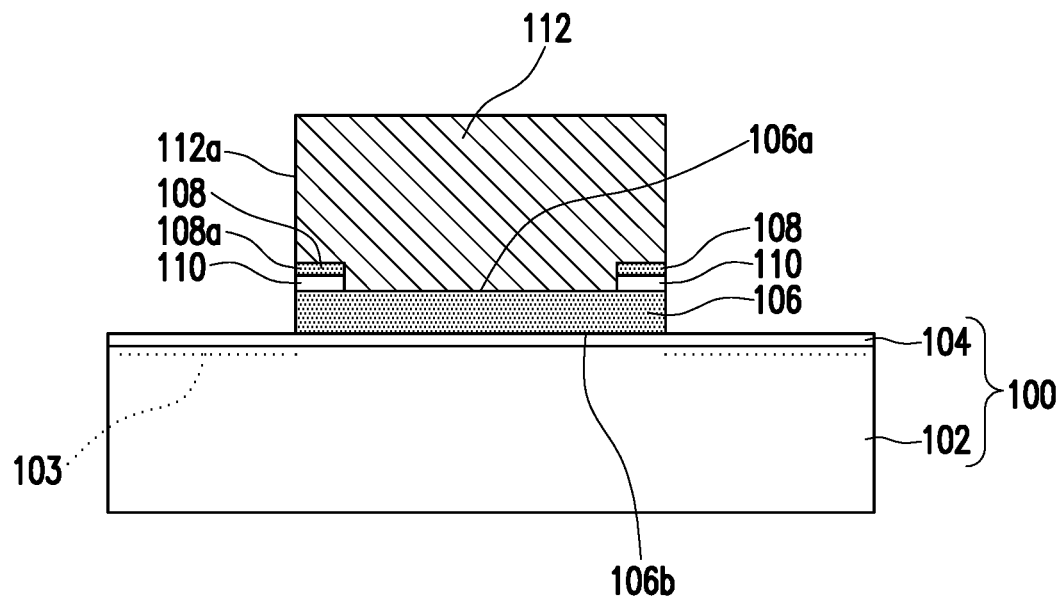
FIG. 1A is a schematic cross-sectional view showing a gate structure of a gallium nitride HEMT according to a first embodiment of the present disclosure.

The drawings in the following embodiments are exemplary embodiments intended to provide a more complete description of the disclosure, but the disclosure may be implemented in many different forms and should not be construed as being limited to the provided embodiments. In the drawings, the relative thickness and location of layers, regions, and/or structural elements may be reduced or exaggerated for clarity.

FIG. 1A is a schematic cross-sectional view showing a gate structure of a gallium nitride HEMT according to a first embodiment of the present disclosure.

Referring to FIG. 1A, the gate structure of the first embodiment includes a heterogeneous structure 100 having a channel layer 102 and a barrier layer 104, a doped gallium nitride layer 106, an insulating layer 108, an undoped gallium nitride layer 110 and a gate metal layer 112. In the heterogeneous structure 100, a two-dimensional electron gas (2 DEG) 103 may be formed at the interface between the channel layer 102 and the barrier layer 104. The doped gallium nitride layer 106 is located on the barrier layer 104, and the barrier layer 104 is located on the channel layer 102. The material of the channel layer 102 is, for example, gallium nitride (GaN), and the material of the barrier layer 104, is, for example, aluminum gallium nitride (AlGaN), and the doped gallium nitride layer 106 as a gate may be a p-type gallium nitride layer or an n-type gallium nitride layer. The area of the bottom portion 106b of the doped gallium nitride layer 106 is approximately equal to (or greater than) the area of the top portion 106a, but the disclosure is not limited thereto. The insulating layer 108 is located on both sides of the top portion 106a of the doped gallium nitride layer 106, wherein the material of the insulating layer 108 is, for example, silicon nitride ($Si_3N_4$), aluminum oxide ($Al_2O_3$), silicon oxide ($SiO_2$), boron nitride (BN) or aluminum nitride (AlN), but the disclosure is not limited thereto. In one embodiment, a ratio of the area of the insulating layer 108 to the area of the top portion 106a of the doped gallium nitride layer 106 is about 50% or less, such as 30% or less, or 20% or less. Since the effect of the insulating layer 108 is to block the sidewall leakage of the gate metal layer 112 by high resistance itself, the position of the insulating layer 108 of the present disclosure is disposed at both sides of the top portion 106a of the doped gallium nitride layer 106, thereby ensuring the effect of reducing gate leakage. The area ratio of the insulating layer 108 is set on basis of not affecting the operation of elements and therefore is not limited to the above range. In an embodiment, the side surface 112a of the gate metal layer 112 may be aligned with the side surface 108a of the insulating layer 108; or the side surface 112a of the gate metal layer 112 may be slightly retracted without being aligned with the side surface 108a of the insulating layer 108.

Further referring to FIG. 1A, the undoped gallium nitride layer 110 of the present embodiment is located between the doped gallium nitride layer 106 and the insulating layer 108, and only covers a portion of the doped gallium nitride layer 106, such that the gate metal layer 112 located on the gallium nitride layer 106 can directly contact the doped gallium nitride layer 106 and cover the insulating layer 108 and the undoped gallium nitride layer 110. The undoped gallium nitride layer 110 can protect the underlying doped gallium nitride layer 106. In addition, although not depicted in FIG. 1A, it should be known that the heterogeneous structure 100 can grow sequentially on a substrate (not shown) by epitaxial techniques (such as MBE or MOCVD), and if the substrate is made of sapphire, silicon carbide (SiC), zinc oxide (ZnO), silicon (Si), gallium oxide ($Ga_2O_3$), etc., it is possible to grow a single-layer or multi-layer buffer structure (not shown) on the substrate for reducing the problem of lattice mismatch between the substrate and the channel layer 102 before growing the heterogeneous structure 100.

Figure 1B:
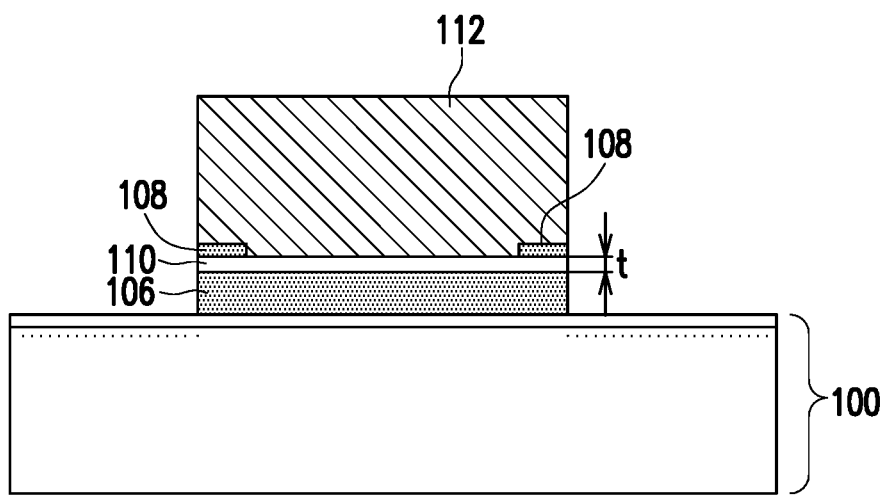
FIG. 1B is a schematic cross-sectional view showing another gate structure of a gallium nitride HEMT of the first embodiment.

FIG. 1B is a schematic cross-sectional view showing another gate structure of a gallium nitride HEMT of the first embodiment.

In FIG. 1B, the undoped gallium nitride layer 110 completely covers the doped gallium nitride layer 106, wherein the thickness t of the undoped gallium nitride layer 110 is, for example, less than 200 angstroms. Since the undoped gallium nitride layer 110 completely covers the surface of the doped gallium nitride layer 106, the doped gallium nitride layer 106 can be further protected from being affected and destroyed by the subsequent manufacturing process of gate metal.

Figure 2:
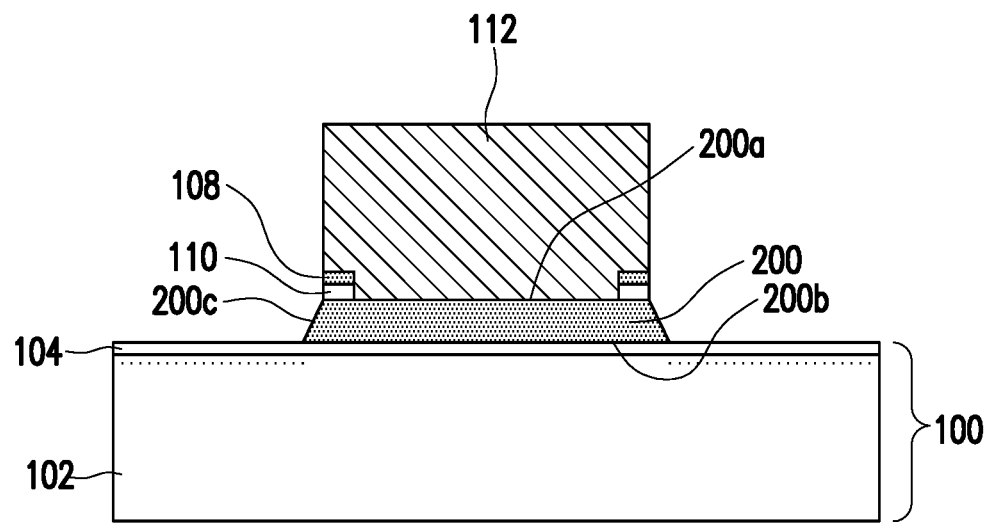
FIG. 2 is a cross-sectional view showing a gate structure of a gallium nitride HEMT according to a second embodiment of the present disclosure.

FIG. 2 is a cross-sectional view showing a gate structure of a gallium nitride HEMT according to a second embodiment of the present disclosure, wherein the same or similar components are denoted by the same reference numerals in FIG. 1A, and the omitted technical description, such as the position of each layer or region, size, material, doped or not, function, etc. may be derived from the content of FIG. 1A, and thus related descriptions are omitted herein.

In FIG. 2, the area of the bottom portion 200b of the doped gallium nitride layer 200 is larger than the area of the top portion 200a, so the leakage path on the side surface 200c of the doped gallium nitride layer 200 becomes longer as compared with the first embodiment, thus further reducing gate leakage. Further, as compared with the first embodiment, the area of the top portion 200a of the doped gallium nitride layer 200 becomes smaller, the area ratio of the insulating layer 108 may be increased; alternatively, the area of the insulating layer 108 becomes smaller. However, the disclosure is not limited thereto.

Figure 3:
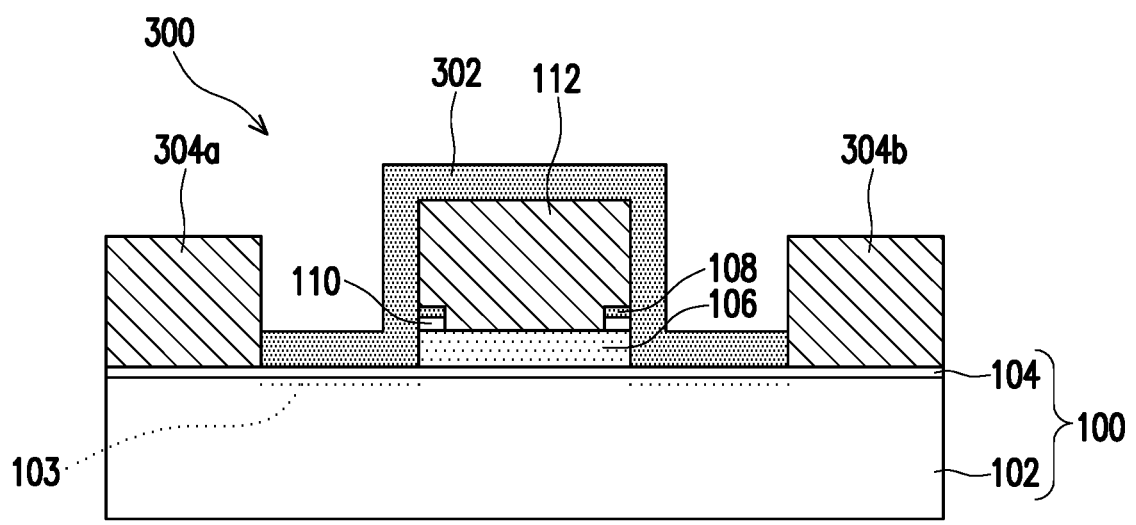
FIG. 3 is a schematic cross-sectional view of a gallium nitride HEMT including the gate structure of FIG. 1A.

FIG. 3 is a schematic cross-sectional view showing the structure in FIG. 1A applied to a gallium nitride HEMT, wherein the same or similar components are denoted by the same reference numerals in FIG. 1A.

Referring to FIG. 3, a gallium nitride HEMT 300 may include the gate structure of the first embodiment, the source 304a, the drain 304b, and the covering heterogeneous structure 100, the doped gallium nitride layer 106, the insulating layer 108, the undoped gallium nitride layer 110, and the passivation layer 302 of the gate metal layer 112. The passivation layer 302 may be used to relieve stress, and the material thereof is, for example, silicon nitride or silicon oxide. The source 304a and the drain 304b are respectively formed at both sides of the gate metal layer 112 and directly in contact with the barrier layer 104. However, the present disclosure is not limited thereto, and in another embodiment, the source 304a and the drain 304b may pass through the barrier layer 104 to be in direct contact with the channel layer 102.

In summary, the present disclosure not only can block the current leakage on the side of the gate by disposing the insulating layer and the undoped gallium nitride layer at the bottom on both sides of the gate metal layer, but also can protect the doped gallium nitride layer as the gate by using the undoped gallium nitride layer, thereby ensuring the effect of the gate and further improving the reliability of the gallium nitride HEMT.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A gate structure of a gallium nitride high electron mobility transistor (HEMT), comprising:
   a heterogeneous structure, comprising a channel layer and a barrier layer disposed on the channel layer;
   a doped gallium nitride layer, disposed on the barrier layer;
   an insulating layer, disposed on both sides of a top portion of the doped gallium nitride layer;

an undoped gallium nitride layer, disposed between the doped gallium nitride layer and the insulating layer; and a gate metal layer, disposed on the doped gallium nitride layer and covering the insulating layer and the undoped gallium nitride layer, and the gate metal layer is in direct contact with the doped gallium nitride layer.

2. The gate structure of the gallium nitride HEMT according to claim 1, wherein the undoped gallium nitride layer covers a portion of the doped gallium nitride layer.

3. The gate structure of the gallium nitride HEMT according to claim 1, wherein the doped gallium nitride layer is a p-type gallium nitride layer or an n-type gallium nitride layer.

4. The gate structure of the gallium nitride HEMT according to claim 1, wherein a material of the insulating layer comprises silicon nitride, aluminum oxide, silicon oxide, boron nitride or aluminum nitride.

5. The gate structure of the gallium nitride HEMT according to claim 1, wherein a ratio of an area of the insulating layer to an area of the top portion of the doped gallium nitride layer is 50% or less.

6. The gate structure of the gallium nitride HEMT according to claim 1, wherein an area of a bottom portion of the doped gallium nitride layer is greater than or equal to an area of the top portion.

7. The gate structure of the gallium nitride HEMT according to claim 1, wherein the undoped gallium nitride layer has a thickness of less than 200 angstroms.

8. The gate structure of the gallium nitride HEMT according to claim 1, wherein a side surface of the gate metal layer is aligned with a side surface of the insulating layer.

9. The gate structure of the gallium nitride HEMT according to claim 1, wherein a material of the channel layer comprises gallium nitride, and a material of the barrier layer comprises aluminum gallium nitride.

10. A gallium nitride HEMT, comprising the gate structure according to claim 1.

\* \* \* \* \*